United States Patent
Nelson et al.

(10) Patent No.: US 10,962,728 B2
(45) Date of Patent: Mar. 30, 2021

(54) CO-PACKAGED OPTICS AND TRANSCEIVER

(71) Applicant: ROCKLEY PHOTONICS LIMITED, London (GB)

(72) Inventors: David Arlo Nelson, Fort Collins, CO (US); Seungjae Lee, Pasadena, CA (US); Brett Sawyer, Pasadena, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/824,609

(22) Filed: Mar. 19, 2020

(65) Prior Publication Data

US 2020/0219865 A1    Jul. 9, 2020

Related U.S. Application Data

(63) Continuation-in-part of application No. 16/393,763, filed on Apr. 24, 2019, now Pat. No. 10,872,854.
(Continued)

(51) Int. Cl.
*G02B 6/42* (2006.01)
*H01L 23/498* (2006.01)
(Continued)

(52) U.S. Cl.
CPC ...... *G02B 6/4274* (2013.01); *H01L 23/49838* (2013.01); *H01L 24/09* (2013.01);
(Continued)

(58) Field of Classification Search
None
See application file for complete search history.

(56) References Cited

U.S. PATENT DOCUMENTS

| 8,781,267 B2 | 7/2014 | Julien et al. |
| 9,082,745 B2 | 7/2015 | Morris |

(Continued)

FOREIGN PATENT DOCUMENTS

| DE | 20 2018 101 250 U1 | 6/2018 |
| KR | 10-2017-0073706 | 6/2017 |

(Continued)

OTHER PUBLICATIONS

International Search Report and Written Opinion of the International Searching Authority, dated Oct. 9, 2019, Corresponding to PCT/IB2019/000607, 13 pages.

(Continued)

*Primary Examiner* — Jerry Rahll
(74) *Attorney, Agent, or Firm* — Lewis Roca Rothgerber Christie LLP

(57) ABSTRACT

An assembly. In some embodiments, the assembly includes: a photonic integrated circuit; and an electronic integrated circuit. A front surface of the photonic integrated circuit abuts, in an area of overlap, against a front surface of the electronic integrated circuit. A first portion of the photonic integrated circuit overhangs a first edge of the electronic integrated circuit, and a first portion of the electronic integrated circuit overhangs a first edge of the photonic integrated circuit. A conductor on the front surface of the electronic integrated circuit is connected, in the area of overlap, to a conductor on the front surface of the photonic integrated circuit.

20 Claims, 6 Drawing Sheets

Related U.S. Application Data

(60) Provisional application No. 62/967,965, filed on Jan. 30, 2020, provisional application No. 62/662,619, filed on Apr. 25, 2018.

(51) Int. Cl.
  *H01L 23/00* (2006.01)
  *H01L 25/18* (2006.01)
  *H01L 25/00* (2006.01)
  *H01L 31/02* (2006.01)

(52) U.S. Cl.
  CPC ........ *H01L 23/49827* (2013.01); *H01L 25/18* (2013.01); *H01L 25/50* (2013.01); *H01L 31/02005* (2013.01); *H01L 2224/023* (2013.01); *H01L 2924/1433* (2013.01)

(56) References Cited

U.S. PATENT DOCUMENTS

| | | |
|---|---|---|
| 9,391,708 B2 | 7/2016 | Fincato et al. |
| 9,490,240 B2 | 11/2016 | Lucero et al. |
| 9,496,248 B2 | 11/2016 | Lee et al. |
| 9,515,746 B2 | 12/2016 | Flens et al. |
| 9,557,478 B2 | 1/2017 | Doerr et al. |
| 9,575,267 B1 | 2/2017 | Shastri et al. |
| 9,935,088 B2 | 4/2018 | Budd et al. |
| 2005/0285214 A1 | 12/2005 | Krishnamoorthy et al. |
| 2012/0014639 A1 | 1/2012 | Doany et al. |
| 2013/0308898 A1 | 11/2013 | Doerr et al. |
| 2014/0064659 A1 | 3/2014 | Doerr et al. |
| 2014/0203175 A1 | 7/2014 | Kobrinsky et al. |
| 2016/0013866 A1 | 1/2016 | Doerr |
| 2016/0124164 A1 | 5/2016 | Doerr |
| 2019/0243066 A1 | 8/2019 | Mahgerefteh et al. |

FOREIGN PATENT DOCUMENTS

| | | |
|---|---|---|
| WO | WO 2013/165344 A1 | 11/2013 |
| WO | WO 2014/014846 A2 | 1/2014 |
| WO | WO 2016/061312 A1 | 4/2016 |
| WO | WO 2016/077500 A8 | 5/2016 |

OTHER PUBLICATIONS

International Search Report and Written Opinion of the International Searching Authority, dated Sep. 23, 2019, Corresponding to PCT/IB2019/000382, 13 pages.
International Search Report and Written Opinion of the International Searching Authority, dated Sep. 30, 2019, Corresponding to PCT/IB2019/000383, 13 pages.
U.S. Appl. No. 16/382,076, filed Apr. 11, 2019.
U.S. Appl. No. 16/383,309, filed Apr. 12, 2019.
U.S. Appl. No. 16/393,763, filed Apr. 24, 2019.
U.S. Appl. No. 16/836,815, filed Mar. 31, 2020.
U.S. Office Action from U.S. Appl. No. 16/393,763, dated Mar. 18, 2020, 7 pages.
Website: "Silicon Wafer Integrated Fan-out Technology (SWIFTTM) Packaging for Highly Integrated Products", Amkor, https://c44f5d406df450f4a66b-1b94a87d576253d9446df0a9ca62e142.ssl.cf2.rackcdn.com/2017/12/SWIFT_Packaging_for_Highly_Integrated_Products_WhitePaper_0617.pdf, printed on Apr. 8, 2018, 4 pages.
Hofmeister, J.P. et al., "Ball Grid Array (BGA) Solder Joint Intermittency Detection: SJ BIST", 2008, IEEEAC paper #1148, Version 8, pp. 1-11, IEEE.
Invitation to Pay Fees and Partial International Search Report of the International Searching Authority, dated Jul. 21, 2020, Corresponding to PCT/EP2020/061482, 14 pages.

CO-PACKAGED OPTICS AND TRANSCEIVER

CROSS-REFERENCE TO RELATED APPLICATION(S)

The present application claims priority to and the benefit of U.S. Provisional Application No. 62/967,965, filed Jan. 30, 2020, entitled "IMPROVED CO-PACKAGING OPTICS AND TRANSCEIVER"; and the present application is a continuation-in-part of U.S. patent application Ser. No. 16/393,763, filed Apr. 24, 2019, entitled "ELECTRO-OPTICAL PACKAGE AND METHOD OF FABRICATION", which claims the benefit of U.S. Provisional Application No. 62/662,619, filed Apr. 25, 2018 entitled "PACKAGING OF OPTICAL AND ELECTRONIC COMPONENTS". All of the applications identified in this paragraph are incorporated herein by reference.

FIELD

One or more aspects of embodiments according to the present disclosure relate to optoelectronic systems, and more particularly to a system and method for co-packaging optics and transceiver components.

BACKGROUND

Some systems for packaging a photonic integrated circuit and an electronic integrated circuit, such as fanout wafer level packaging (FOWLP), may contain a redistribution layer (RDL) on one or both surfaces of the electronic integrated circuit and through vias (through the electronic integrated circuit) to route signals from a front surface to a back surface of the electronic integrated circuit. Such a system may have certain drawbacks. For example, the thickness of the RDL may increase the interconnect path length between the photonic integrated circuit and the electronic integrated circuit. This added length increases the inductance of the connection and reduces the bandwidth of circuits—for example of a photodetector on the photonic integrated circuit and a transimpedance amplifier on the electronic integrated circuit. This limits the achievable data rate when an RDL is used. Further, if the back surface of the electronic integrated circuit is used as an electrical interconnect, the presence of this interconnect may be an obstacle to the placing of a heat sink directly on the electronic integrated circuit, and heat may instead flow through the photonic integrated circuit to a heatsink, resulting in an increase in thermal resistance and potentially resulting in higher operating temperatures for temperature-sensitive devices in the photonic integrated circuit.

Thus, there is a need for an improved system and method for co-packaging optics and transceiver components.

SUMMARY

According to an embodiment of the present invention, there is provided an assembly, including: a photonic integrated circuit; and an electronic integrated circuit, a front surface of the photonic integrated circuit abutting, in an area of overlap, against a front surface of the electronic integrated circuit, a first portion of the photonic integrated circuit overhanging a first edge of the electronic integrated circuit, and a first portion of the electronic integrated circuit overhanging a first edge of the photonic integrated circuit, a conductor on the front surface of the electronic integrated circuit being connected, in the area of overlap, to a conductor on the front surface of the photonic integrated circuit.

In some embodiments, the first edge of the electronic integrated circuit is opposite the first portion of the electronic integrated circuit and the first edge of the photonic integrated circuit is opposite the first portion of the photonic integrated circuit.

In some embodiments, the conductor on the front surface of the electronic integrated circuit is connected, in the area of overlap, by a metal bump, to the conductor on the front surface of the photonic integrated circuit, the metal bump being one of a plurality of metal bumps, the metal bumps being arranged on a grid over a rectangular array, metal bumps being absent from grid points at the corners of the rectangular array.

In some embodiments, in the area of overlap: no redistribution layer is present on the electronic integrated circuit, and no redistribution layer is present on the photonic integrated circuit.

In some embodiments, the assembly further includes a printed circuit board, abutting against the first portion of the electronic integrated circuit.

In some embodiments, the assembly further includes a compressible membrane connector between the first portion of the electronic integrated circuit and the printed circuit board, a conductor on the first portion of the electronic integrated circuit being connected to a conductor on the printed circuit board through a conductor in the compressible membrane connector.

In some embodiments, the assembly further includes a digital integrated circuit on the printed circuit board, the digital integrated circuit being connected to the electronic integrated circuit through: a conductor on the printed circuit board, and a conductor in the compressible membrane connector.

In some embodiments, the assembly further includes: a heat sink on the digital integrated circuit; and a heat sink on the electronic integrated circuit.

In some embodiments, the assembly is configured to permit replacement of: the photonic integrated circuit, and the electronic integrated circuit, without removing the heat sink from the digital integrated circuit.

In some embodiments: the photonic integrated circuit includes a photodetector, and the electronic integrated circuit includes an amplifier connected to the photodetector by a conductive path having a length less than 500 microns.

In some embodiments, the length of the conductive path is less than 200 microns.

In some embodiments, the length of the conductive path is less than 100 microns.

In some embodiments: the photonic integrated circuit includes a photodetector, and the electronic integrated circuit includes an amplifier connected to the photodetector; and wherein a signal path from optical input, of light carrying amplitude modulation, to the photodetector, to output from the amplifier, of an electrical signal corresponding to the amplitude modulation, has a 3 dB bandwidth of at least 10 GHz.

In some embodiments, the signal path has a 3 dB bandwidth of at least 60 GHz.

In some embodiments: the photonic integrated circuit includes a modulator, and the electronic integrated circuit includes an amplifier connected to the modulator by a conductive path having a length less than 500 microns.

In some embodiments, the length of the conductive path is less than 200 microns.

In some embodiments, the length of the conductive path is less than 100 microns.

In some embodiments: the photonic integrated circuit includes a modulator, and the electronic integrated circuit includes an amplifier connected to the modulator; and wherein a signal path from input of an electrical signal to the amplifier to output, from the modulator, of light carrying amplitude modulation corresponding to the electrical signal has a 3 dB bandwidth of at least 10 GHz.

In some embodiments, the signal path has a 3 dB bandwidth of at least 40 GHz.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a system and method for co-packaging optics and transceiver components provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
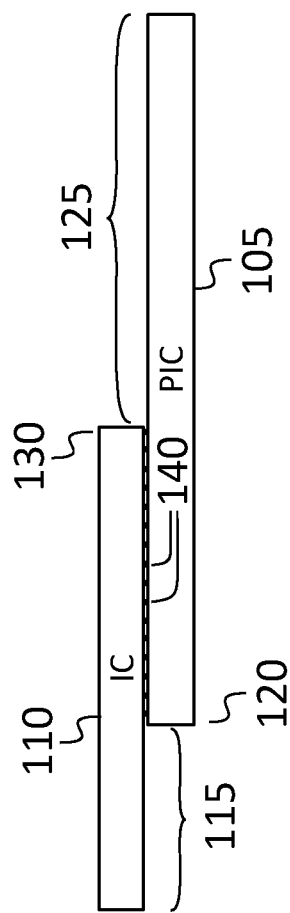
FIG. 1A is a side view of a flip-chip assembly, according to an embodiment of the present disclosure.
Figure 1B:
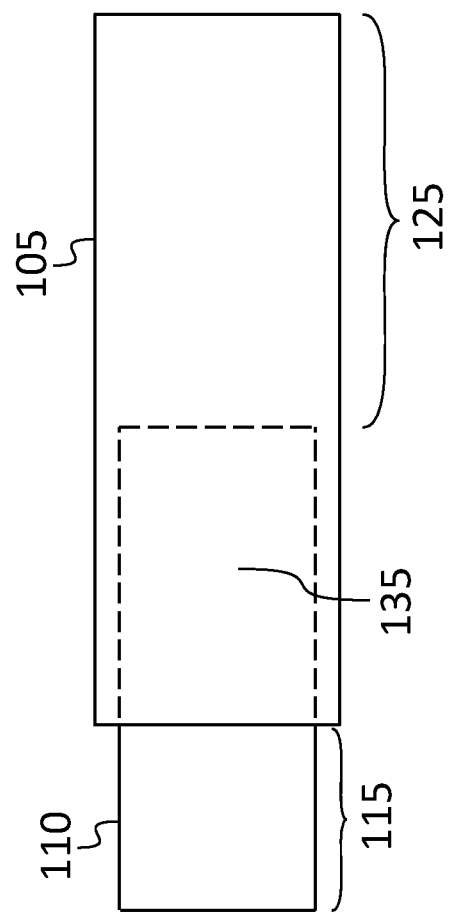
FIG. 1B is a bottom view of a flip-chip assembly, according to an embodiment of the present disclosure.

Referring to FIGS. 1A and 1B, in some embodiments, short electrical connections between (i) a component (e.g., a photodetector and/or modulator) on a photonic integrated circuit 105 (PIC) and (ii) a component or circuit (e.g., a transimpedance amplifier and/or modulator driver) on an electronic integrated circuit 110 may be formed by flip-chip bonding the photonic integrated circuit 105 to the electronic integrated circuit 110 to form a flip-chip assembly. The photonic integrated circuit may include a substrate (e.g., a silicon substrate) having a front surface (the upper surface of the photonic integrated circuit 105, in the orientation of FIG. 1A), on or in which may be V-grooves (for passive alignment to an optical fiber, not shown for ease of illustration), optical waveguides, optoelectronic devices (e.g., photodetectors and modulators), and one or more metal layers forming conductive traces for routing electrical signals to and from the optoelectronic devices. The optical waveguides may include mode converters (e.g., tapered sections) e.g., for converting between a mode that may propagate in a 3-micron wide waveguide and (i) a mode that may propagate in a single-mode fiber, or (ii) a mode that may produce a useful intensity distribution in an optoelectronic device. The electronic integrated circuit 110 may have a length between 5 mm and 15 mm (e.g., a length of 10.2 mm) and a width between 2 mm and 9 mm (e.g., a width of 4.4 mm) and the photonic integrated circuit 105 may have a length between 7 mm and 30 mm (e.g., a length of 15 mm) and a width between 3 mm and 11 mm (e.g., a width of 5.5 mm).

The electronic integrated circuit 110 may be a silicon integrated circuit, and the front surface of the electronic integrated circuit 110 (the lower surface, in the orientation of FIG. 1A) may include interface circuits for interfacing with the optoelectronic devices, e.g., transimpedance amplifiers for amplifying photocurrents generated by photodetectors on the photonic integrated circuit 105, and modulator drivers for driving modulators (e.g., electro-absorption (EA) modulators) on the photonic integrated circuit 105. Each of these interface circuits may be part of a respective high speed channel on the front surface of the electronic integrated circuit 110. Each high speed channel may include (in addition to the interface circuit), a serial receiver circuit (for a high speed channel connected to a modulator) or a serial transmitter circuit (for a high speed channel connected to a photodetector). These serial receiver and transmitter circuits may be, for example, XSR or USR receiver or transmitter circuits, and they may be used for exchanging data with a digital electronic circuit (e.g., a switch application specific integrated circuit (ASIC)) as discussed in further detail below. Each high speed channel may further include circuitry for connecting the interface circuit to the serial receiver circuit or serial transmitter circuit (e.g., a clock and data recovery circuit connected to the transimpedance amplifier, in the case of a high speed channel connected to a photodetector). The circuits on the electronic integrated circuit 110 may occupy a relatively small fraction (e.g., less than one half or less than one quarter) of the area of the electronic integrated circuit 110, and in some embodiments the excess area may be employed, e.g., to fabricate a microcontroller on the first portion 115 of the electronic integrated circuit 110.

In some embodiments, the electrical connection between an optoelectronic device on the photonic integrated circuit 105 and the corresponding interface circuit (e.g., amplifier) on the electronic integrated circuit 110 may have a length of less than 500 microns, or less than 200 microns, or less than 100 microns. In some embodiments, the length may be nearly as small as the height of the metal bumps 140 (e.g., copper pillar bumps, discussed in further detail below) forming connections between the photonic integrated circuit 105 and the electronic integrated circuit 110. In some embodiments, the analog portion of a receiving channel (e.g., a photodetector and a transimpedance amplifier connected to the photodetector) may have a bandwidth (e.g., a 3 dB bandwidth) of at least 10 GHz, or at least 20 GHz, or at least 60 GHz, where the bandwidth is defined in terms of the transfer function from amplitude modulation on light received by the photodetector, to the corresponding signal at the output of the transimpedance amplifier. The bandwidth may be a relatively sensitive function of the aforementioned interconnect length between the PIC 140 an IC 110, e.g., a relatively small increase in the interconnect length may result in a significant decrease in bandwidth. Similarly, the analog portion of a transmitting channel (e.g., a modulator and a drive amplifier in the modulator driver connected to the modulator) may have a bandwidth (e.g., a 3 dB bandwidth) of at least 10 GHz, or at least 20 GHz, or at least 60 GHz, where the bandwidth is defined in terms of the transfer function from an electrical signal at the input of the drive amplifier to the corresponding amplitude modulation produced by the modulator. The bandwidth may be a relatively sensitive function of the aforementioned interconnect length between the PIC 140 an IC 110, e.g., a relatively small increase in the interconnect length may result in a significant decrease in bandwidth. In some embodiments, the configuration of FIGS. 1A and 1B makes it unnecessary for the electronic integrated circuit 110 (or the photonic integrated circuit 105) to have a redistribution layer on either surface; it may be sufficient instead to have a relatively small number of patterned metal layers (e.g., 10 or fewer metal layers) on one or both of the electronic integrated circuit 110 and the photonic integrated circuit 105.

The photonic integrated circuit 105 and the electronic integrated circuit 110 may be offset from each other so that each of the photonic integrated circuit 105 and the electronic integrated circuit 110 overhangs the other, as illustrated in FIG. 1A. In particular, a first portion 115 of the electronic integrated circuit 110 may overhang a first edge 120 of the photonic integrated circuit 105 and a first portion 125 of the photonic integrated circuit 105 may overhang a first edge 130 of the electronic integrated circuit 110. Referring to FIG. 1B, the photonic integrated circuit 105 and the electronic integrated circuit 110 may overlap in an area of overlap 135. In some embodiments, the first portion 125 of the photonic integrated circuit 105 and the first portion 115 of the electronic integrated circuit 110 are on opposite sides of the area of overlap 135 (as shown, for example, in FIG. 1B) and the area of overlap 135 is generally between the first portion 115 of the electronic integrated circuit 110 and the first portion 125 of the photonic integrated circuit 105. In other embodiments the relative positions may be different; for example, the first portion 115 of the electronic integrated circuit 110 may extend away from the area of overlap 135 in a first direction and the first portion 125 of the photonic integrated circuit 105 may extend away from the area of overlap 135 in a second direction, perpendicular to the first direction.

In the area of overlap 135 the photonic integrated circuit 105 and the electronic integrated circuit 110 may be secured together and electrically connected through a plurality of metal bumps. For example, a plurality of solder-topped copper pillar bumps 140 (e.g. Cu/Ni/SnAg bumps) may be formed on the front surface of the photonic integrated circuit 105, and a corresponding plurality of pads 145 (e.g., Ni/Au pads) may be formed on the front surface of the electronic integrated circuit 110; the photonic integrated circuit 105 may then be soldered to the electronic integrated circuit 110, with each solder-topped copper pillar bump 140 of the photonic integrated circuit 105 in the area of overlap being soldered to a respective pad on the electronic integrated circuit 110. The soldering may be performed, for example, using thermocompression bonding.

Each of the copper pillar bumps 140 may have a diameter of between 25 um (microns) and 100 um and a height of between 25 um and 100 um. Each of the copper pillar bumps 140 may be formed on a pad opening (e.g., an opening in an insulating (e.g., silicon dioxide) layer on the front surface of the photonic integrated circuit 105) having a diameter of between 10 um and 70 um.

Figures 2A, 2B:
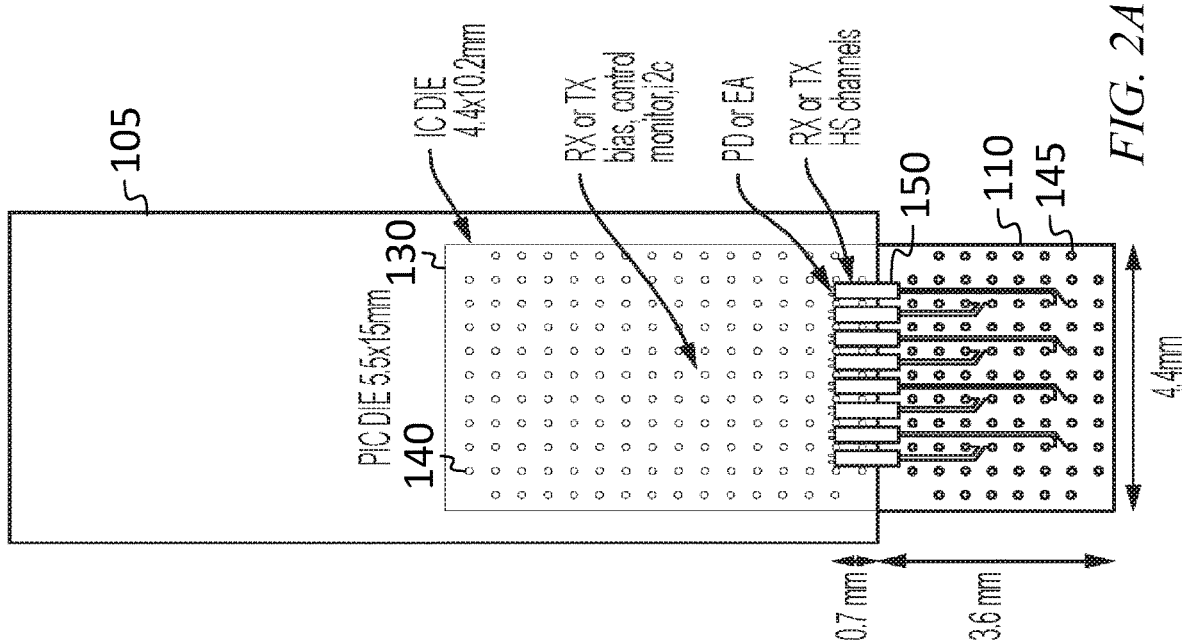
FIG. 2A is a top view of a flip-chip assembly, according to an embodiment of the present disclosure.
FIG. 2B is a pinout diagram, according to an embodiment of the present disclosure.
Figure 5:
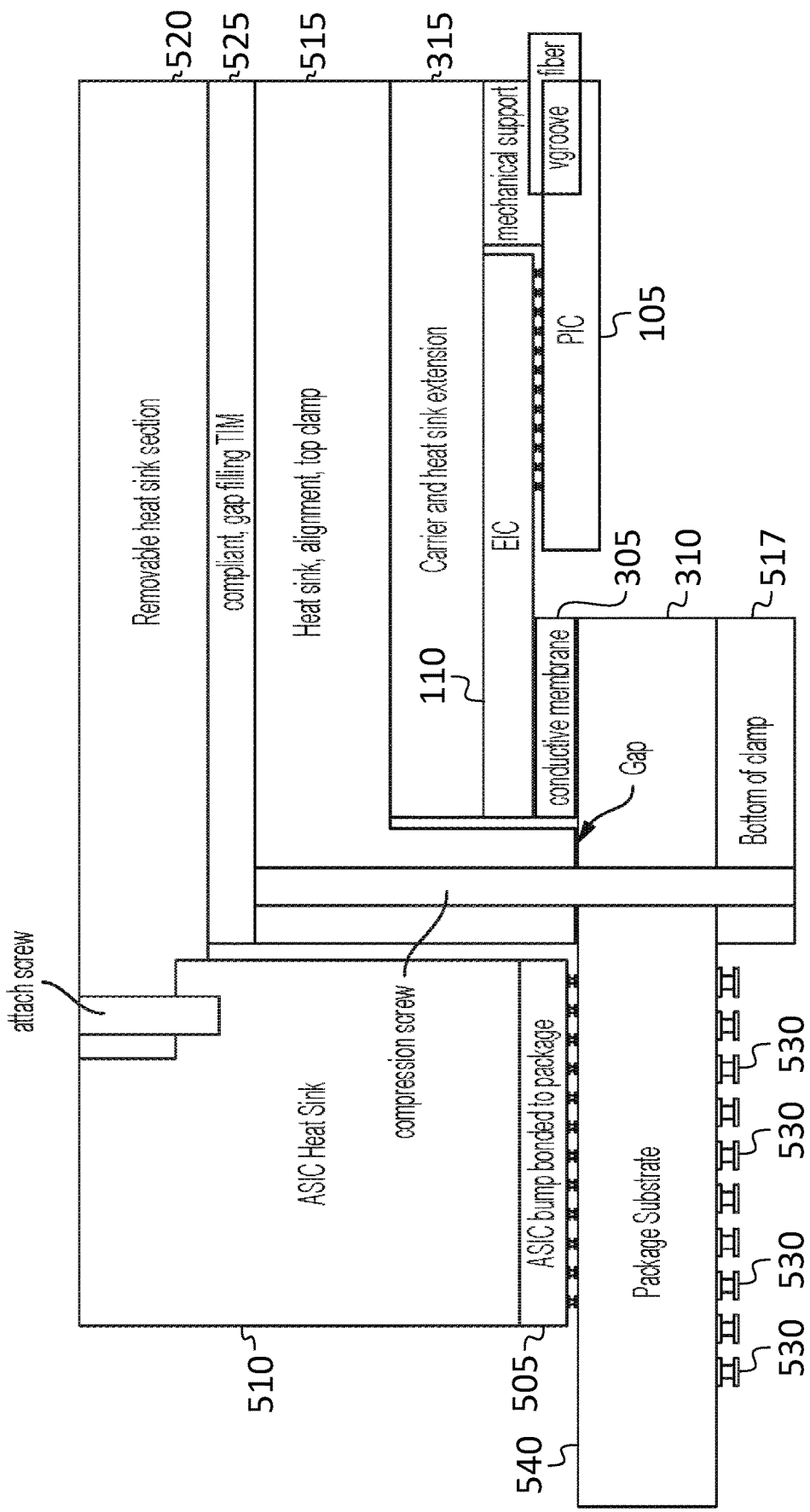
FIG. 5 is a side view of an assembly, according to an embodiment of the present disclosure.

Referring to FIG. 2A, the copper pillar bumps 140 in the area of overlap 135 may be on a grid (e.g., a grid with a pitch between 50 um and 150 um) substantially filling the area of overlap 135, which may be rectangular as shown. In some embodiments, the corner bumps may be omitted as shown, for stress relief. The pads 145 (e.g., Ni/Au pads) on the electronic integrated circuit 110 may have a diameter exceeding 100 um (in an embodiment in which the pitch of the grid exceeds 100 um). The pitch of the copper pillar bumps 140 may be chosen based on design channel count and density. For example, reducing bump pitch (and channel pitch accordingly) reduces the width of the PIC 105 and electronic integrated circuit 110. A reduction in chip width increases bandwidth density and reduces overall product form factor within high volume manufacturing limits. For example, in some embodiments the optical engines discussed herein are populated on the edge of the printed circuit board 310 which may form the substrate of the switch ASIC package (FIG. 5). This substrate form factor is ultimately determined by the widths of the PIC 105 and the electronic integrated circuit 110, which is dependent on bump pitch. Furthermore, reducing the substrate form factor improves the aforementioned serializer-deserializer performance and reduces cost in high volume. This is discussed in further detail below. Each of the high speed channels 150 may be connected by a pair of conductive traces on the front surface of the electronic integrated circuit 110 to a respective pair of pads, or "connector bumps" (e.g., Ni/Au) in the first portion 115 of the front surface of the electronic integrated circuit 110 as part of a connection (e.g., an XSR or USR connection, or other suitable serial electrical connection) to, e.g., a switch ASIC, as discussed in further detail below. The pads in the first portion 115 of the front surface of the electronic integrated circuit 110 may be similar to, although they may have different dimensions from, the pads on the front surface of the electronic integrated circuit 110 in the area of overlap 135. FIG. 2B shows an example of a candidate pin assignment for the connector bumps. The corner connector bumps may be absent (as shown in FIG. 2A) or present (as shown in FIG. 2B).

The optoelectronic devices may be located in a row approximately 700 um from the first edge 120 of the photonic integrated circuit 105 (the lower edge, in the orientation of FIG. 2A), and each of the high speed channels 150 may extend from a respective optoelectronic device, in the area of overlap 135, into the first portion 115 of the electronic integrated circuit 110, as shown in FIG. 2A. The V-grooves are not shown in FIG. 2A, for ease of illustration.

Figure 3:
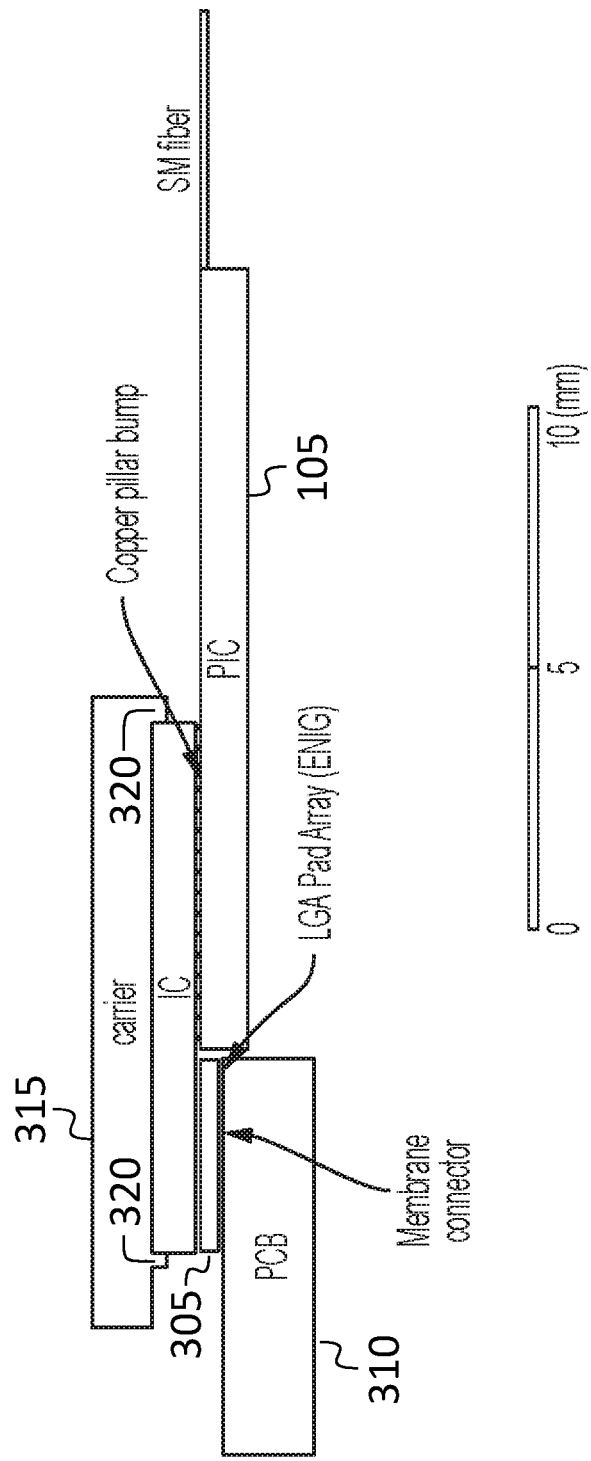
FIG. 3 is a side view of an assembly, according to an embodiment of the present disclosure.

In some embodiments, the assembly of FIGS. 1A, 1B, and 2A is made part of a larger assembly as shown in FIG. 3. A compressible membrane connector 305 (e.g., a compressible membrane connector forms a plurality of conductive paths between the pads 145 on front surface of the first portion 115 of the electronic integrated circuit 110 and corresponding pads on a printed circuit board 310 (which may form connections to a switch ASIC, as discussed in further detail below). A carrier 315 may be secured to the back surface of the electronic integrated circuit 110 (the back surface being the surface opposite the front surface of the electronic integrated circuit 110). The carrier 315 may have one or more alignment ridges 320, which may be used to align the electronic integrated circuit 110 to the carrier 315 during assembly. The carrier 315 may provide mechanical reinforcement to the electronic integrated circuit 110 and to the photonic integrated circuit 105 to reduce the risk of damage during assembly, and, in operation, it may provide a heat flow path for heat dissipated in the electronic integrated circuit 110 to be conducted away. The carrier 315 may be composed of copper or of another thermally conductive material.

In some embodiments, all of the optoelectronic devices on a photonic integrated circuit 105 are the same. For example, on a photonic integrated circuit 105 that may be referred to as a receiving PIC (Rx PIC), all of the optoelectronic devices are photodetectors, and the interface circuits, on the electronic integrated circuit 110 connected to the PIC (which may be referred to as an Rx IC), are all transimpedance amplifiers. Similarly, on a photonic integrated circuit 105 that may be referred to as a transmitting PIC (Tx PIC), all of the optoelectronic devices may be modulators, and the interface circuits, on the electronic integrated circuit 110 connected to the PIC (which may be referred to as a Tx IC), are all modulator drivers.

Figure 4:
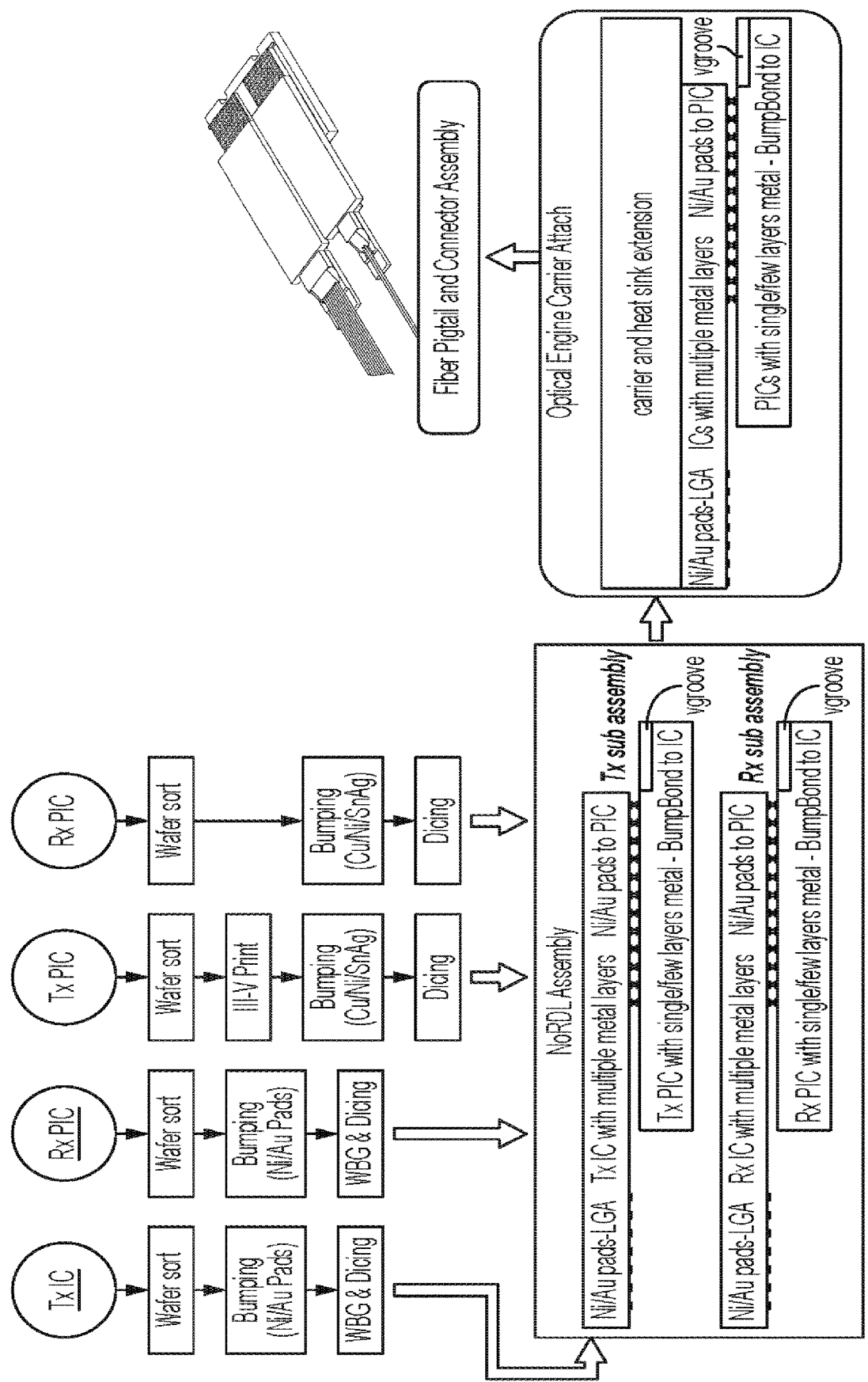
FIG. 4 is an assembly flow diagram, according to an embodiment of the present disclosure.

FIG. 4 shows a fabrication flow, in some embodiments. A Tx IC is prepared using steps including bumping (with the Ni/Au pads 145), wafer-back grinding, and dicing, and an Rx IC is similarly prepared using steps including bumping (with the Ni/Au pads 145), wafer-back grinding, and dicing. Wafer back grinding may be employed to reduce overall thickness of the Tx IC or Rx IC while also reducing case to junction thermal resistance between the IC and ASIC heat sink discussed in further detail below. A Tx PIC is prepared using steps including III-V micro-transfer printing (to place the modulators, which may be III-V devices, on the PIC), bumping (with the copper pillar bumps 140), and dicing, and an Rx PIC is prepared using steps including bumping (with the copper pillar bumps 140), and dicing. The Tx IC is then soldered to the Tx PIC to form an assembly that may be referred to as a "Tx sub assembly", and the Rx IC is then soldered to the Rx PIC to form an assembly that may be referred to as a "Rx sub assembly". The Tx sub assembly and the Rx sub assembly are then secured to a carrier 315, and fiber pigtails are attached to the PICs, to form an assembly that may be referred to as an optical engine. In these sub assemblies the PIC may be substantially thicker than the IC especially in the case when the IC is subject to wafer-back grinding during wafer preparation. A thicker PIC reduces warpage to support fine pitch bump assembly in 135 and improves component rigidity after fiber pigtail assembly. In some embodiments, the photonic integrated circuit 105 has a thickness between 500 microns and 1000 microns, e.g., about 680 microns, and the electronic integrated circuit 110 has a thickness between 100 microns and 700 microns, e.g., 580 microns.

One or more optical engines may be used to provide optical interfaces to a digital integrated circuit 505 (e.g., a switch ASIC) as shown in FIG. 5. An ASIC heat sink 510 conducts heat away from the digital integrated circuit 505 (e.g., to a heat-pipe-based cooling system). A top clamp 515 (together with a bottom portion 517) secures the optical engine and the compressible membrane connector 305 to the printed circuit board 310 and conducts away heat flowing through the carrier 315 from the optical engine; the top clamp is thermally connected to a removable heat sink section 520 through a layer of compliant thermal interface material 525. In the embodiment of FIG. 5, the carrier 315 lacks the alignment ridges 320 shown in FIG. 3; in other embodiments, however, one or more alignment ridges 320 may be present, and the structure may otherwise be similar to that illustrated in FIG. 5. The printed circuit board 310 may form the substrate of a package, including the elements illustrated in FIG. 5, that may be secured and connected to another printed circuit board (e.g., a motherboard) by an array of conductors 530 on the lower surface of the printed circuit board 310. Such a motherboard may have a hole or cutout to accommodate the bottom portion 517 of the clamp. A second beachfront 540 may be used to accommodate another optical engine (not shown), or, for example, an edge connector for making serial electrical connections to the digital integrated circuit 505 (as discussed in further detail below).

Figure 6:
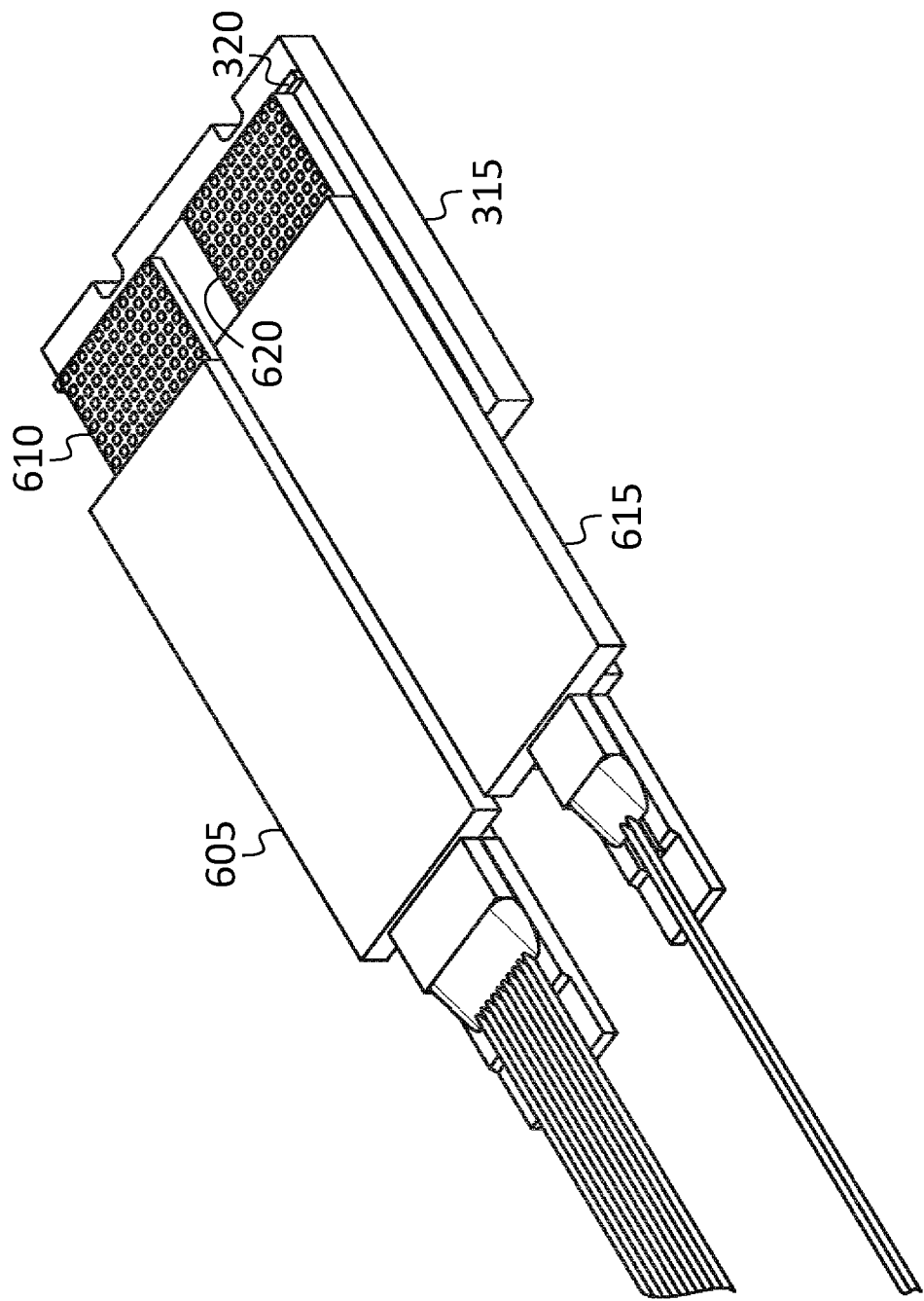
FIG. 6 is a perspective view of an assembly, according to an embodiment of the present disclosure.

FIG. 5 is not drawn to scale. In some embodiments, the digital integrated circuit 505 is rectangular (e.g., square) and sufficiently large to accommodate one or more optical engines on each of its four edges, providing a plurality of optical interfaces to the digital integrated circuit 505. In some embodiments, digital integrated circuit 505 has a plurality of electrical serial transmitter and receivers, and the package provides direct electrical connections (e.g., at the second beachfront 540) to a first plurality of the electrical serial transmitter and receivers of the digital integrated circuit 505 and (as shown on the right hand side of FIG. 5), optical connections, through one or more optical engines, to a second plurality of the high speed channels of the digital integrated circuit 505. In an embodiment with a plurality of optical engines, it may be advantageous to be able to replace any one of the optical engines (e.g., to install a different version of an optical engine, or to replace a failed optical engine) without, e.g., removing the ASIC heat sink 510 from the digital integrated circuit 505. Such replacement of the optical engine is made possible by the configuration of FIG. 5. FIG. 6 is a perspective view of an optical engine, with fibers installed. The optical engine includes a Tx PIC 605, a Tx IC 610, an Rx PIC 615, and an Rx IC 620. An example implementation is an embodiment that provides up to 1.6T throughput. If using FR4 the highest number of fibers may be 20 Tx fibers and 4 Rx fibers.

As used herein, the word "or" is inclusive, so that, for example, "A or B" means any one of (i) A, (ii) B, and (iii) A and B. As used herein, the term "rectangle" includes a square as a special case, i.e., a square is an example of a rectangle. It will be understood that when an element or layer is referred to as being "on", "connected to", "coupled to", "abutting against" or "adjacent to" another element or layer, it may be directly on, connected to, coupled to, abutting against, or adjacent to the other element or layer, or one or more intervening elements or layers may be present. In contrast, when an element or layer is referred to as being "directly on", "directly connected to", "directly coupled to", "abutting directly against" or "immediately adjacent to" another element or layer, no intervening elements or layers are present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for co-packaging optics and transceiver components have been specifically described and illustrated herein, many modifications and variations will be apparent to those skilled in the art. Accordingly, it is to be understood that a system and method for co-packaging optics and transceiver components constructed according to principles of this disclosure may be embodied other than as specifically described herein. The invention is also defined in the following claims, and equivalents thereof.

What is claimed is:
1. An assembly, comprising:
a photonic integrated circuit comprising an optoelectronic device; and
an electronic integrated circuit comprising an interface circuit,
a front surface of the photonic integrated circuit abutting, in an area of overlap, against a front surface of the electronic integrated circuit,
a first portion of the photonic integrated circuit overhanging a first edge of the electronic integrated circuit, and
a first portion of the electronic integrated circuit overhanging a first edge of the photonic integrated circuit,
a conductor on the front surface of the electronic integrated circuit being connected, in the area of overlap, to a conductor on the front surface of the photonic integrated circuit,
a signal path either from a signal input of the optoelectronic device to an output signal of the interface circuit, or from a signal input of the interface circuit to an output signal of the optoelectronic device, has a 3 dB bandwidth of at least 10 GHz.

2. The assembly of claim 1, wherein the first edge of the electronic integrated circuit is opposite the first portion of the electronic integrated circuit and the first edge of the photonic integrated circuit is opposite the first portion of the photonic integrated circuit.

3. The assembly of claim 1, wherein:
the optoelectronic device is a photodetector, and
the interface circuit is an amplifier connected to the photodetector; and
wherein the signal path is
from optical input, of light carrying amplitude modulation, to the photodetector,
to output from the amplifier, of an electrical signal corresponding to the amplitude modulation.

4. The assembly of claim 3, wherein the signal path has a 3 dB bandwidth of at least 60 GHz.

5. The assembly of claim 1, wherein:
the optoelectronic device is a modulator, and
the interface circuit is an amplifier connected to the modulator by a conductive path having a length less than 500 microns.

6. The assembly of claim 5, wherein the length of the conductive path is less than 200 microns.

7. The assembly of claim 5, wherein the length of the conductive path is less than 100 microns.

8. The assembly of claim 1, wherein:
the optoelectronic device is a modulator, and
the interface circuit is an amplifier connected to the modulator; and
wherein the signal path is
from input of an electrical signal to the amplifier
to output, from the modulator, of light carrying amplitude modulation corresponding to the electrical signal.

9. The assembly of claim 8, wherein the signal path has a 3 dB bandwidth of at least 40 GHz.

10. The assembly of claim 1, wherein:
the optoelectronic device is a photodetector, and
the interface circuit is an amplifier connected to the photodetector by a conductive path having a length less than 500 microns.

11. The assembly of claim 10, wherein the length of the conductive path is less than 200 microns.

12. The assembly of claim 10, wherein the length of the conductive path is less than 100 microns.

13. The assembly of claim 1, wherein, in the area of overlap:
no redistribution layer is present on the electronic integrated circuit, and
no redistribution layer is present on the photonic integrated circuit.

14. An assembly, comprising:
a photonic integrated circuit; and
an electronic integrated circuit,
a front surface of the photonic integrated circuit abutting, in an area of overlap, against a front surface of the electronic integrated circuit,
a first portion of the photonic integrated circuit overhanging a first edge of the electronic integrated circuit, and
a first portion of the electronic integrated circuit overhanging a first edge of the photonic integrated circuit,
a conductor on the front surface of the electronic integrated circuit being connected, in the area of overlap, to a conductor on the front surface of the photonic integrated circuit,
wherein the conductor on the front surface of the electronic integrated circuit is connected, in the area of overlap, by a metal bump, to the conductor on the front surface of the photonic integrated circuit, the metal bump being one of a plurality of metal bumps, the metal bumps being arranged on a grid over a rectangular array, metal bumps being absent from grid points at the corners of the rectangular array.

15. An assembly, comprising:
a photonic integrated circuit;
an electronic integrated circuit; and
a printed circuit board,
a front surface of the photonic integrated circuit abutting, in an area of overlap, against a front surface of the electronic integrated circuit,
a first portion of the photonic integrated circuit overhanging a first edge of the electronic integrated circuit,
a first portion of the electronic integrated circuit overhanging a first edge of the photonic integrated circuit,
a conductor on the front surface of the electronic integrated circuit being connected, in the area of overlap, to a conductor on the front surface of the photonic integrated circuit,
the printed circuit board abutting against the first portion of the electronic integrated circuit, and
a compressible membrane connector between the first portion of the electronic integrated circuit and the printed circuit board, a conductor on the first portion of the electronic integrated circuit being connected to a conductor on the printed circuit board through a conductor in the compressible membrane connector.

16. The assembly of claim 15, further comprising a digital integrated circuit on the printed circuit board, the digital integrated circuit being connected to the electronic integrated circuit through:
a conductor on the printed circuit board, and
a conductor in the compressible membrane connector.

17. The assembly of claim 16, further comprising:
a heat sink on the digital integrated circuit; and
a heat sink on the electronic integrated circuit.

18. The assembly of claim 17, wherein the assembly is configured to permit replacement of:
the photonic integrated circuit, and the electronic integrated circuit,
without removing the heat sink from the digital integrated circuit.

19. The assembly of claim 15, wherein, in the area of overlap:
   no redistribution layer is present on the electronic integrated circuit, and
   no redistribution layer is present on the photonic integrated circuit.

20. The assembly of claim 15, wherein the first edge of the electronic integrated circuit is opposite the first portion of the electronic integrated circuit and the first edge of the photonic integrated circuit is opposite the first portion of the photonic integrated circuit.

* * * * *